United States Patent
Xi et al.

(10) Patent No.: US 8,722,136 B2
(45) Date of Patent: May 13, 2014

(54) HEAT STRENGTHENING OF A GLASS SUPERSTRATE FOR THIN FILM PHOTOVOLTAIC DEVICES

(75) Inventors: Yangang Andrew Xi, Eden Prairie, MN (US); Frank Sanford Prescott, Berthoud, CO (US); Scott Daniel Feldman-Peabody, Golden, CO (US); Donald E. Rhonehouse, The Villages, FL (US); Mark Jeffrey Pavol, Arvada, CO (US)

(73) Assignee: First Solar, Inc., Tempe, AZ (US)

( * ) Notice: Subject to any disclaimer, the term of this patent is extended or adjusted under 35 U.S.C. 154(b) by 273 days.

(21) Appl. No.: 13/278,464

(22) Filed: Oct. 21, 2011

(65) Prior Publication Data
US 2013/0098111 A1    Apr. 25, 2013

(51) Int. Cl.
*B05D 7/00*    (2006.01)

(52) U.S. Cl.
USPC ............................................................ 427/74

(58) Field of Classification Search
USPC ............................................................ 427/74
See application file for complete search history.

(56) References Cited

U.S. PATENT DOCUMENTS

| | | | | |
|---|---|---|---|---|
| 3,994,711 A * | 11/1976 | McMaster | | 65/163 |
| 4,371,739 A | 2/1983 | Lewis et al. | | |
| 5,022,930 A | 6/1991 | Ackerman et al. | | |
| 5,248,349 A | 9/1993 | Foote et al. | | |
| 5,304,499 A | 4/1994 | Bonnet et al. | | |
| 5,366,764 A | 11/1994 | Sunthankar | | |
| 5,372,646 A | 12/1994 | Foote et al. | | |
| 5,470,397 A | 11/1995 | Foote et al. | | |
| 5,536,333 A * | 7/1996 | Foote et al. | | 136/260 |
| 5,712,187 A | 1/1998 | Li et al. | | |
| 5,994,642 A | 11/1999 | Higuchi et al. | | |
| 6,169,246 B1 | 1/2001 | Wu et al. | | |
| 6,423,565 B1 * | 7/2002 | Barth et al. | | 438/57 |
| 6,429,369 B1 * | 8/2002 | Tober et al. | | 136/265 |
| 6,444,043 B1 | 9/2002 | Gegenwart et al. | | |
| 6,624,009 B1 * | 9/2003 | Green et al. | | 438/149 |
| 6,719,848 B2 | 4/2004 | Faykosh et al. | | |
| 7,194,197 B1 | 3/2007 | Wendt et al. | | |
| 2002/0117199 A1 | 8/2002 | Oswald | | |
| 2003/0044539 A1 | 3/2003 | Oswald | | |
| 2005/0000564 A1 * | 1/2005 | Sato et al. | | 136/256 |
| 2009/0194165 A1 | 8/2009 | Murphy et al. | | |
| 2010/0311204 A1 * | 12/2010 | Komin et al. | | 438/98 |
| 2011/0073362 A1 | 3/2011 | Shimizu | | |

FOREIGN PATENT DOCUMENTS

| | | |
|---|---|---|
| EP | 0853345 A1 | 7/1998 |
| EP | 0640247 B1 | 12/2007 |
| WF | WO 2009/148078 | 12/2009 |

* cited by examiner

*Primary Examiner* — Robert Vetere
(74) *Attorney, Agent, or Firm* — MacMillan, Sobanski & Todd, LLC (57) ABSTRACT

Process and apparatus are generally provided for forming a thin film photovoltaic device. In one particular embodiment, the process includes: depositing a photovoltaic absorber layer on a glass substrate; heating the glass substrate to an anneal temperature; and quenching the glass substrate to cool the glass substrate to a quenched temperature in less than 10 seconds. The quenched temperature can be about 85° C. to about 200° C. less than the anneal temperature. The quenching atmosphere can have a quenching pressure of about 1 torr or more and can include an inert gas.

17 Claims, 5 Drawing Sheets

HEAT STRENGTHENING OF A GLASS SUPERSTRATE FOR THIN FILM PHOTOVOLTAIC DEVICES

FIELD OF THE INVENTION

The subject matter disclosed herein relates generally to methods and systems for heat strengthening a glass substrate for thin film photovoltaic devices. More particularly, the subject matter disclosed herein relates generally to methods and systems for quenching a glass superstrate for thin film photovoltaic devices.

BACKGROUND OF THE INVENTION

Solar energy systems using cadmium telluride (CdTe) photovoltaic (PV) modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, the use of relatively thin glass superstrates can limit the absorption of light energy by the glass superstrate in use, allowing more light to reach the PV thin films. Furthermore, thin glass can be less expensive than thick glass. However, the use of relatively thin glass substrates reduces the strength of the glass. As such, the glass may be more susceptible to breakage in use.

Thus, a need exists for a PV module having improved strength in its glass superstrate and methods of manufacturing the same.

BRIEF DESCRIPTION OF THE INVENTION

Aspects and advantages of the invention will be set forth in part in the following description, or may be obvious from the description, or may be learned through practice of the invention.

Process and apparatus are generally provided for forming a thin film photovoltaic device. In one particular embodiment, the process includes: depositing a photovoltaic absorber layer on a glass substrate; heating the glass substrate to an anneal temperature; and, quenching the glass substrate with a quenching gas to cool the glass substrate to a quenched temperature in less than 10 seconds. The quenched temperature can be about 85° C. to about 200° C. less than the anneal temperature. The quenching gas can include an inert gas.

For example, in one embodiment, the process can comprising: depositing a cadmium telluride layer on a substrate at a deposition temperature of about 450° C. to about 600° C. in a vapor deposition chamber by heating a source material to produce source vapors that deposit onto the substrate; transporting the substrate from the vapor deposition chamber into an annealing chamber; heating the substrate to an anneal temperature to anneal the cadmium telluride layer at an anneal temperature of about 575° C. to about 650° C.; transporting the substrate from the annealing chamber into a quenching chamber; and, quenching the glass substrate to cool the glass substrate to a quenched temperature of less than 500° C. in a quenching time of less than 10 seconds. The quenching atmosphere can have a quenching pressure of about 1 torr or more, and can include an inert gas.

These and other features, aspects, and advantages of the present invention will become better understood with reference to the following description and appended claims, or may be obvious from the description or claims, or may be learned through practice of the invention.

BRIEF DESCRIPTION OF THE DRAWINGS

A full and enabling disclosure of the present invention, including the best mode thereof, is set forth in the specification, which makes reference to the appended drawings, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer.

Additionally, although the invention is not limited to any particular film thickness, the term "thin" describing any film layers of the photovoltaic device generally refers to the film layer having a thickness less than about 10 micrometers ("microns" or "μm").

Figure 1:
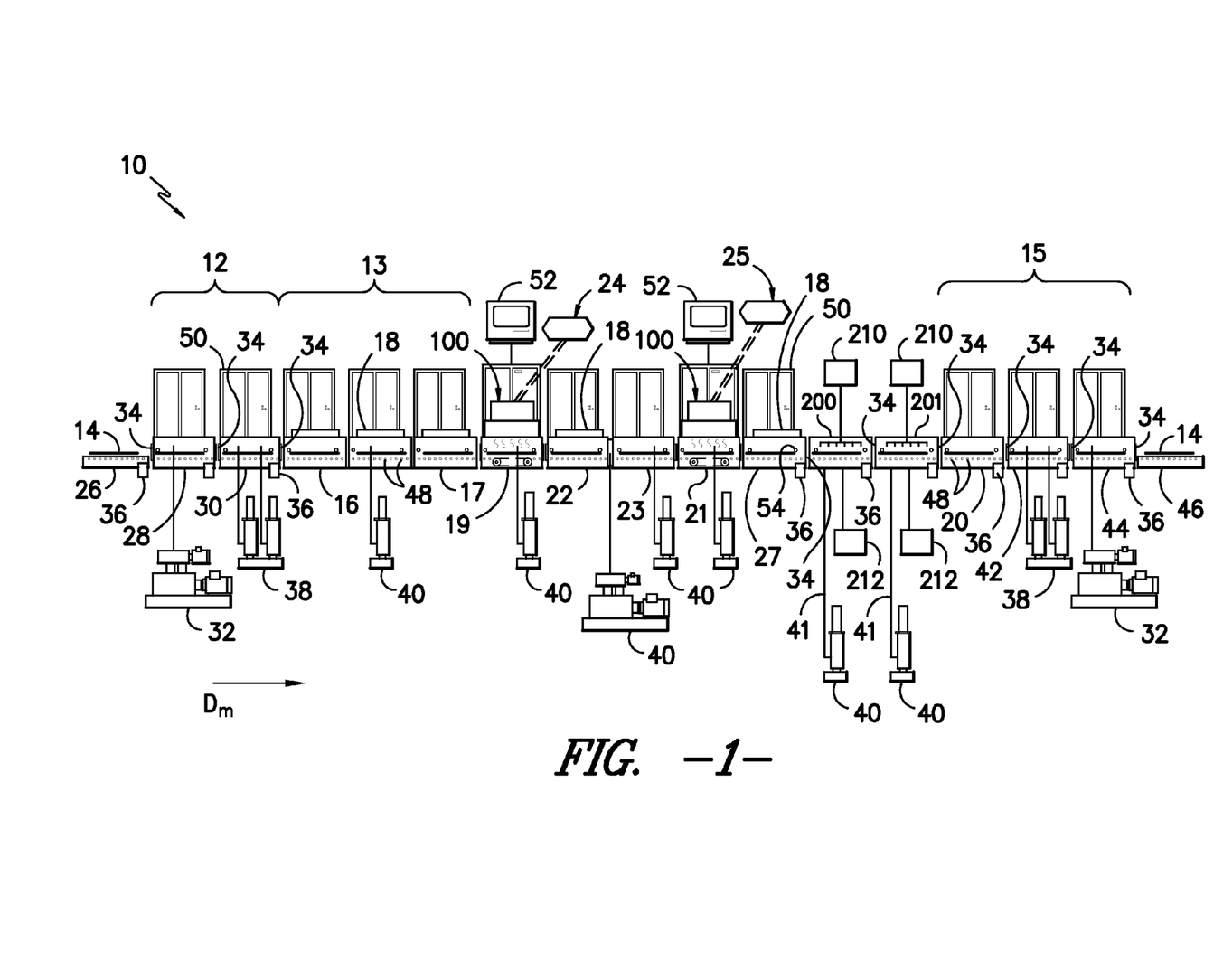
FIG. 1 is a plan view of a system that may incorporate embodiments of a vapor deposition apparatus according to one embodiment.

FIG. 1 illustrates an embodiment of a system 10 that may incorporate at least one vapor deposition apparatus 100, an annealing apparatus 22 and/or 27, and at least one quenching apparatus 200 and/or 201. The vapor deposition apparatus 100, annealing apparatus 22 and/or 27, and quenching apparatus 200 and/or 201 are sequentially positioned within the system 10 in accordance with embodiments of the invention configured for deposition of a thin film layer on a photovoltaic (PV) module substrate 14 (referred to hereafter as a "substrate") and subsequent quenching. The thin film may be, for example, a film layer of cadmium telluride (CdTe). It should be appreciated that the present system 10 is not limited to the vapor deposition apparatus 100 illustrated in FIGS. 2-3. Other vapor deposition apparatus may be used in the system 10 for vapor deposition of a thin film layer onto a PV module substrate 14. Likewise, the present system 10 is not limited to the quenching apparatus illustrated in FIG. 4 or FIG. 5. Other quenching apparatus may be used in the system 10 for quenching of the thin film layer on the substrate 14.

Figure 4:
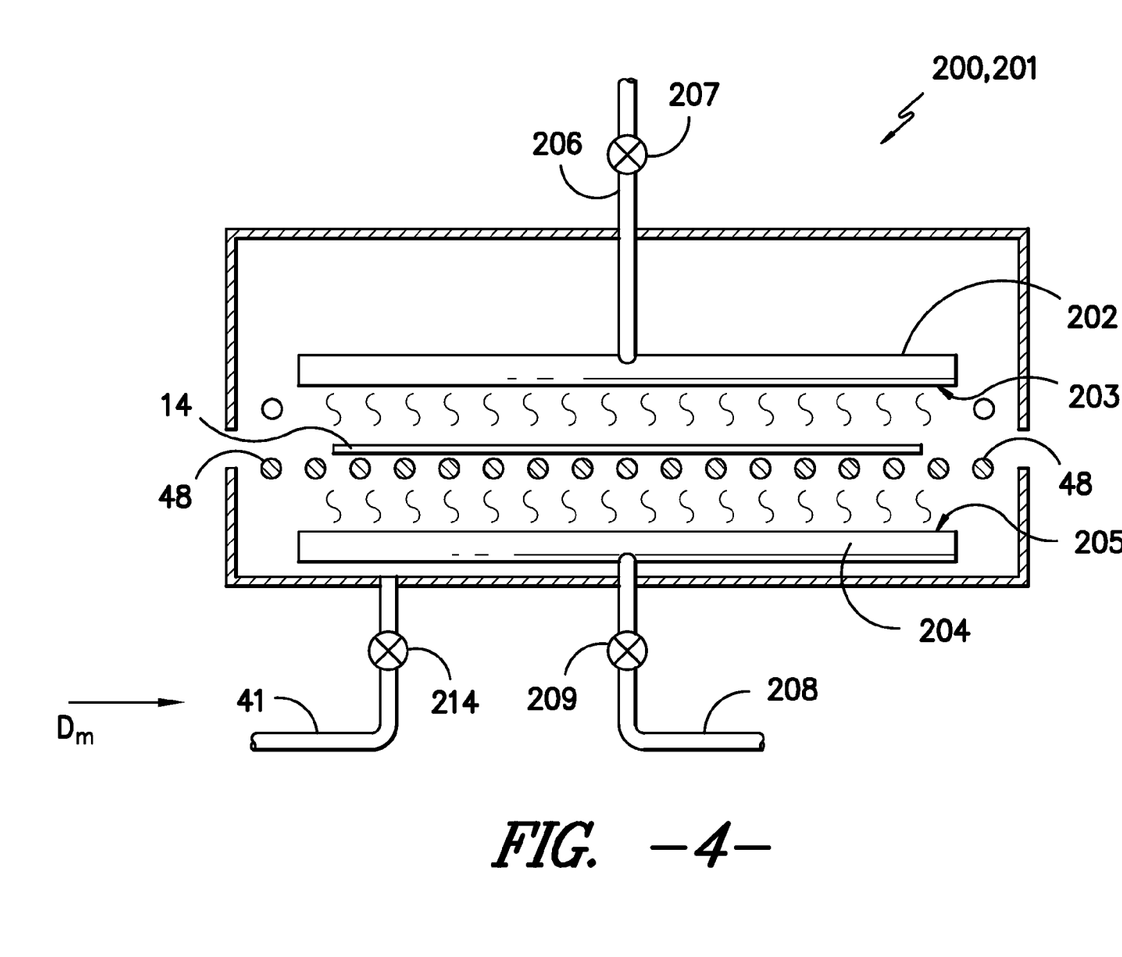
FIG. 4 is a cross-sectional view of an embodiment of a quenching apparatus according to one embodiment; and, FIG. 5 is a cross-sectional view of another embodiment of a quenching apparatus according to one embodiment.
Figure 5:
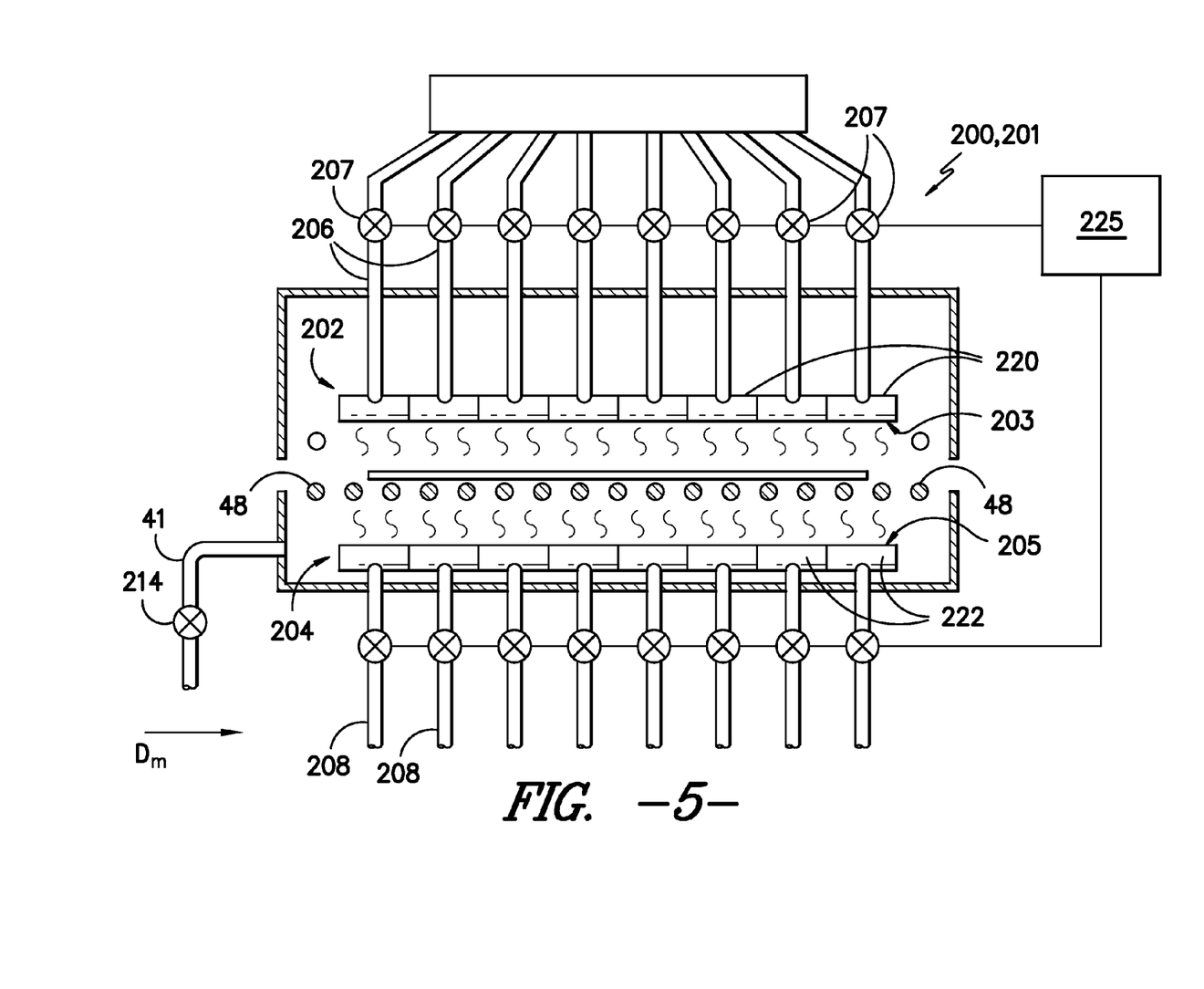

In one particular embodiment, the quenching apparatus 200 and/or 201 is generally configured to cool the glass substrate, after annealing, to a quenched temperature of less than about 450° C. in a quenching time of about 4 seconds to about 30 seconds in a quenching atmosphere (e.g., about 4 seconds to about 10 seconds). In one particular embodiment, the quenching apparatus 200 and/or 201 is generally configured to cool the glass substrate, after annealing, to a quenched temperature of less than about 450° C. in a quenching time of about 4 seconds to about 7 seconds. The quenching atmosphere can have a quenching pressure of about 1 torr or more, such as about 100 torr to about 760 torr.

The quenching atmosphere can generally comprise an inert gas (e.g., argon, neon, nitrogen, helium, xenon, radon, etc., or mixtures thereof). In one particular embodiment, the quenching atmosphere is substantially non-reactive with the thin film layer or the substrate 14. For example, the quenching atmosphere can, in one embodiment, consist essentially of an inert gas or mixture of inert gases, and is thus substantially free from oxygen and other reactive gases that could chemically interact with the deposited thin film layer. As used herein, the term "substantially free" means no more than an insignificant trace amount present and encompasses completely free (e.g., 0 molar % up to 0.01 molar %).

Through annealing and quenching, strength can be added to the coated glass by creating compressive stresses therein, which can help the coated glass endure thermal stress in normal use (e.g., created through temperature variations when deployed in the field). This increased strength can help reduce the occurrence of panel breakage of the resulting PV device once placed in operation in the field. Thus, thinner glass substrates may be able to be used through adding strength to the glass in production of the PV device. For example, the glass substrate can be a borosilicate glass having a thickness of about 0.5 mm to about 2.5 mm, such as about 0.7 mm to about 1.3 mm.

Additionally, the high temperature annealing and quenching can also help to increase the grain size within one or more of the thin film layers and can help to increase the intermixing of the n-type layer (e.g., a CdS layer) and p-type layer (e.g., a CdTe layer) at the heterojunction, as well as potentially freezing in beneficial defects. Thus, this process can not only increase the strength of the glass substrate, but also may result in improved efficiency and reliability of the device.

FIG. 4 shows an exemplary quenching chamber 200 for quenching the glass superstrate after deposition of the thin film layer and is particularly suitable for use in the system 10 shown in FIG. 1. In the embodiment of FIG. 4, the substrates 14 are positioned between the top gas head 202 and bottom gas head 204 within the chamber on the rollers 48. The top gas head 202 is connected to a top source line 206, and the bottom gas head 204 is connected to a bottom source line 208. Each of the top and bottom source lines 206, 208 are configured to supply the quenching gas from gas tanks 210, 212 (shown in FIG. 1) to the chamber 200 for quenching of the substrate 14. The flow of the quenching gas to each of the top gas head 202 and the bottom gas head 204 from the top and bottom source lines 206, 208 can be controlled via valves 207, 209, respectively.

The quenching gas can be forced through the top gas head 202 and the bottom gas head 204 via the top gas plate 203 and bottom gas plate 205. Each of the top gas plate 203 and bottom gas plate 205 define a plurality of apertures to distribute the quenching gas being forced therethrough. As such, the quenching gas can pass through the top gas plate 203 and/or bottom gas plate 205 to reach the substrate 14 with substantially the same flow rate across the entire surface area of the substrate 14. Alternatively, in some instances where differential cooling may prove desirable, a first flow rate can be provided through the top gas plate 203 and a second flow rate can be provided through the bottom gas plate 205.

In one embodiment, the top gas plate 203 can be positioned above the top surface of the substrate 14 at a defined distance. For example, the top gas plate 203 can about 1 cm to about 10 cm from the top surface of the substrate. Likewise, the bottom gas plate 205 can be, in one embodiment, positioned below the bottom surface of the substrate 14 at a defined distance. This distance can vary according to the carrying mechanism employed. In the embodiment shown, the carrying mechanism includes rollers 48 that allow the quenching gas to pass therebetween to reach the bottom surface of the substrate 14.

In one particular embodiment, the substrate 14 can be translated during quenching to help cool the substrate 14 uniformly across its surface area. Through translation, the effect of any inconsistencies in the flow of the quenching gas from either or both of the top and bottom gas plates 203, 205 can be minimized on the substrate 14. This translation can also help the cooling of the bottom surface of the substrate 14 to be more uniform even when rollers 48 are present.

The direction of translation can be, in one embodiment, in the machine direction ($D_m$). For example, the rollers 48 can be rotated quickly to cause the substrate 14 thereon to travel forward. Additionally, or alternatively, the substrate 14 can be translated in the cross-machine direction, which is perpendicular to the machine direction ($D_m$). The translation rate of the substrate 14 can be about 300 mm/s to about 500 mm/s.

A vacuum pump 40 can be attached, in certain embodiments, to the quenching chamber 200, 201 via vacuum pipe 41 in order to control the quenching pressure. The valve 214 in the vacuum pipe 41 can be used to control the quenching pressure within the quenching chamber 200, 201. The quenching pressure can be controlled within the quenching chamber 200, 201 to be about 100 torr to about 760 torr either prior to or after flowing the quenching gas through the top and bottom gas plates 203, 205.

For example, once the substrate 14 the first quenching chamber 200 and the valves 34 are closed by the actuator 36 (shown in FIG. 1), the atmosphere within the quenching chamber 200 can be isolated from adjacent chambers. The pressure can then be adjusted as desired. In one embodiment, the pressure within the quenching chamber 200 can be raised to a quenching pressure of up to about 760 torr (e.g., about 100 torr to about 700 torr) through introducing an inert gas, such as discussed above with respect to the quenching gas.

Then, the quenching can occur through forcing a quenching gas through the top and bottom gas heads 202, 204 and onto the top and bottom surfaces, respectively, of the substrate 14. In one embodiment, the quenching gas can be at or below a quenching temperature (e.g., less than 300° C., such as about 0° C. to about 100° C.) when supplied to the top and bottom gas heads 202, 204 in order to cool the substrate 14. In certain embodiments, the quenching gas can be at or below room temperature (e.g., 25° C.) when supplied to the top and bottom gas heads 202, 204 in order to cool the substrate 14. It is to be understood that the quenching gas pressure and/or temperature supplied through the respective top and bottom gas heads 202, 204 need not always be equivalent, especially if it is desired to vary the top and bottom quench characteristics.

The flow of the quenching gas through the top and bottom gas heads 202, 204 can occur simultaneously, in one particular embodiment, in order to inhibit the formation of significant temperature gradients across the surfaces of the substrate 14 and/or within the thickness of the substrate 14 during quenching. Alternatively, in another embodiment, the respective flows of the quenching gas through the top and bottom gas heads 202, 204 can differ to promote such temperature gradients, e.g., to counteract the presence of thermal expansion mismatch of a given coating and an underlying glass substrate.

The flow rate and flow time can be adjusted based on multiple factors, such as the size of the substrate 14, the amount and speed of cooling desired, etc. In one embodiment, the quenching gas can flow through the top and bottom gas heads 202 at a rate of about 500 cubic feet per minute (cfm) to about 2500 cfm (e.g., about 1000 cfm to about 2000 cfm). At this rate, the quenching gas can flow through the top and bottom gas heads 202, 204 for a quenching time period of about 1 second to about 30 seconds.

The addition of the quenching gas through the top and bottom gas heads 202, 204 can slightly raise the pressure within the quenching chamber 200, 201 (e.g., such as an increase of about 5 torr to about 50 torr). In other embodiments, however, the pressure can be regulated through venting or suction through the vacuum pipe 41 and vacuum pump 40, in order to keep the pressure within the quenching chamber 200, 201 substantially constant (e.g., after the quenching pressure is within 10 torr from the initial quenching pressure).

FIG. 5 shows another exemplary embodiment of a quenching chamber 200, 201 where each of the top and bottom gas heads 202, 204 are compartmentalized into a plurality of head zones 220, 222, respectively. Each of the head zones 220, 222 are connected to a source line 206, 208, respectively. Valves 207, 209 can respectively control the flow rate of the quenching gas to each of the head zones 220, 222. As such, the flow rate of the quenching gas at different areas of the gas heads 202, 204 can be independently controlled and adjusted. Such control can help to substantially uniformly cool the surfaces of the substrate 14 across its entire surface area. In one particular embodiment, a computing device 225 can monitor the temperature across the surfaces of the substrate 14 during quenching through the use of a temperature sensor (not shown) and can then adjust the flow rate accordingly in each head zones 220, 222 through adjustment of the valves 207, 209.

In the embodiment of FIG. 1, quenching can be achieved through the use of a first quenching in the first quenching chamber 200 and a second quenching in the second quenching chamber 201. As such, sequential quenching steps can be used to cool the substrate 14 to the desired temperature. In one embodiment, the substrate can be cooled in the first quenching chamber to a first quenched temperature of about 425° C. to about 500° C. Then, the substrate can be transported from the first quenching chamber to a second quenching chamber and cooled to a second quenched temperature (e.g., less than 400° C.). In one particular embodiment, the first quenching can be achieved in less than 10 seconds (e.g., about 0.5 seconds to about 10 seconds), and the second quenching can each be achieved in a longer quenching time of up to 1 minute (e.g., about 30 seconds to about 1 minute).

Referring to FIG. 1, the individual substrates 14 are initially placed onto a load conveyor 26, and are subsequently moved into an entry vacuum lock station 12 that includes a load vacuum chamber 28 and a load buffer chamber 30. A "rough" (i.e., initial) vacuum pump 32 is configured with the load vacuum chamber 28 to drawn an initial load pressure, and a "fine" (i.e., final) vacuum pump 38 is configured with the load buffer chamber 30 to increase the vacuum (i.e. decrease the initial load pressure) in the load buffer chamber 30 to reduce the vacuum pressure within the entry vacuum lock station 12. Valves 34 (e.g., gate-type slit valves or rotary-type flapper valves) are operably disposed between the load conveyor 26 and the load module 28, between the load vacuum chamber 28 and the load buffer chamber 30, and between the load vacuum chamber 30 and the heating station 13. These valves 34 are sequentially actuated by a motor or other type of actuating mechanism 36 in order to introduce the substrates 14 into the vacuum station 12 in a step-wise manner without affecting the vacuum within the subsequent heating station 13.

In operation of the system 10, an operational vacuum is maintained in the system 10 by way of any combination of rough and/or fine vacuum pumps 40. In order to introduce a substrate 14 into the load vacuum station 12, the load vacuum chamber 28 and load buffer chamber 30 are initially vented (with the valve 34 between the two modules in the open position). The valve 34 between the load buffer chamber 30 and the first heater module 16 is closed. The valve 34 between the load vacuum chamber 28 and load conveyor 26 is opened and a substrate 14 is moved into the load vacuum chamber 28. At this point, the first valve 34 is shut and the rough vacuum pump 32 then draws an initial vacuum in the load vacuum chamber 28 and load buffer chamber 30. The substrate 14 is then conveyed into the load buffer chamber 30, and the valve 34 between the load vacuum chamber 28 and load buffer chamber 30 is closed. The fine vacuum pump 38 then increases the vacuum in the load buffer chamber 30 to approximately the same vacuum in the heating station 13. At this point, the valve 34 between the load buffer chamber 30 and heating station 13 is opened and the substrate 14 is conveyed into the first heater module 16.

Thus, the substrates 14 are transported into the exemplary system 10 first through the load vacuum chamber 28 that draws a vacuum in the load vacuum chamber 12 to an initial load pressure. For example, the initial load pressure can be less than about 250 mTorr, such as about 1 mTorr to about 100 mTorr. Optionally, a load buffer chamber can reduce the pressure to about $1 \times 10^{-7}$ Torr to about $1 \times 10^{-4}$ Torr, and then backfilled with an inert gas (e.g., argon, nitrogen, etc.) in a subsequent chamber within the system 10 (e.g., within the sputtering deposition chamber 112) to a deposition pressure (e.g., about 10 mTorr to about 100 mTorr).

In another embodiment, the apparatus is operated in a purged mode. Instead of pumping out atmosphere at the load station and backfilling to a desired pressure with an inert gas, the chamber is continuously filled at or slightly above atmospheric pressure with an inert gas which keeps atmospheric gases from entering the chamber.

The substrates 14 can then be transported into and through a heating station 13 including heating chambers 16. The plurality of heating chambers 16 define a pre-heat section 13 of the system 10 through which the substrates 14 are conveyed and heated to a first deposition temperature before being conveyed into the vapor deposition chamber 19. Each of the heating chambers 16 may include a plurality of independently controlled heaters 18, with the heaters defining a plurality of different heat zones. A particular heat zone may include more than one heater 18. The heating chambers 16 can heat the substrates 14 to a deposition temperature, such as about 350°

C. to about 600° C. Although shown with three heating chambers 16, any suitable number of heating chambers 16 can be utilized.

Figure 2:
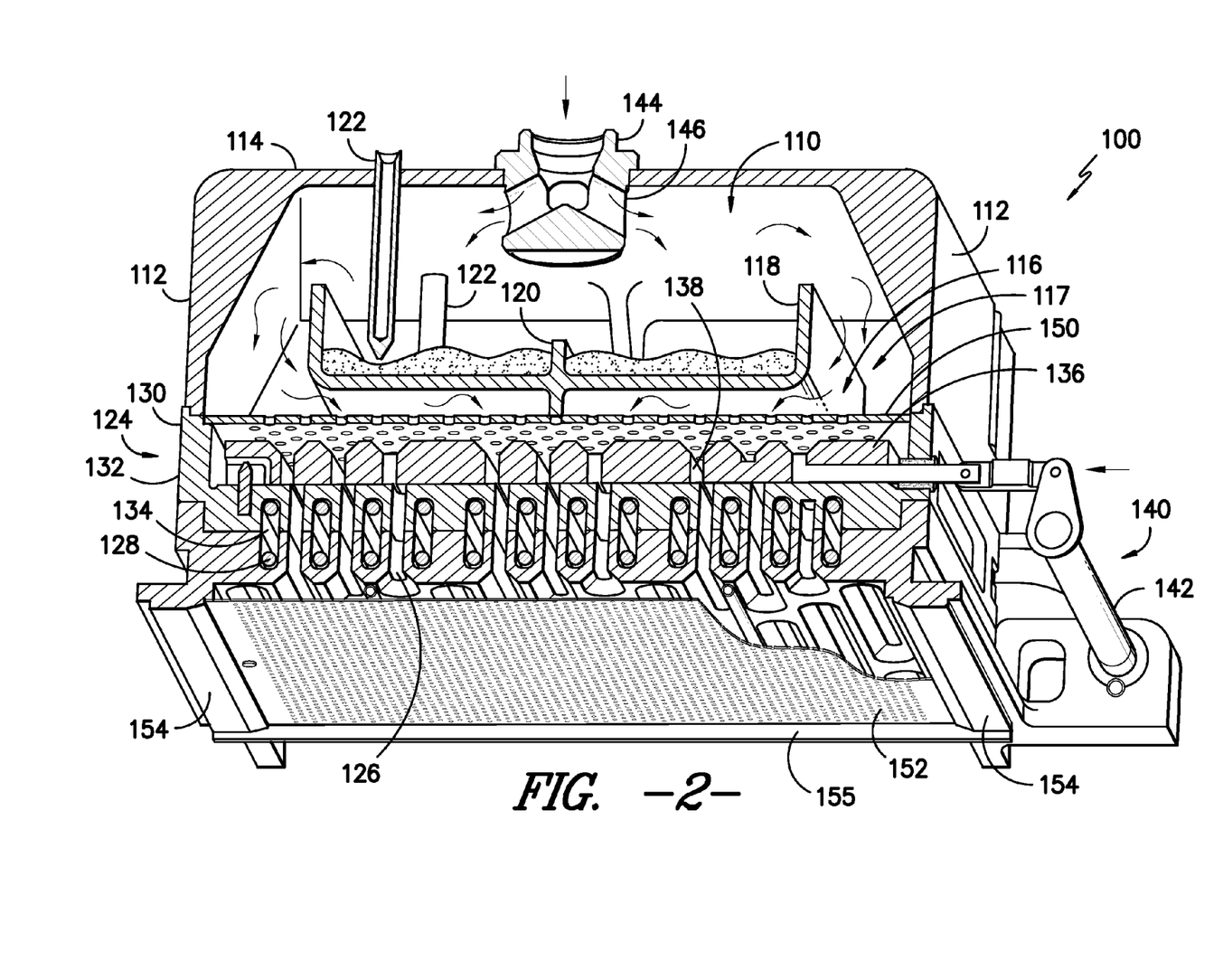
FIG. 2 is a cross-sectional view of an embodiment of a vapor deposition apparatus in a first operational configuration.
Figure 3:
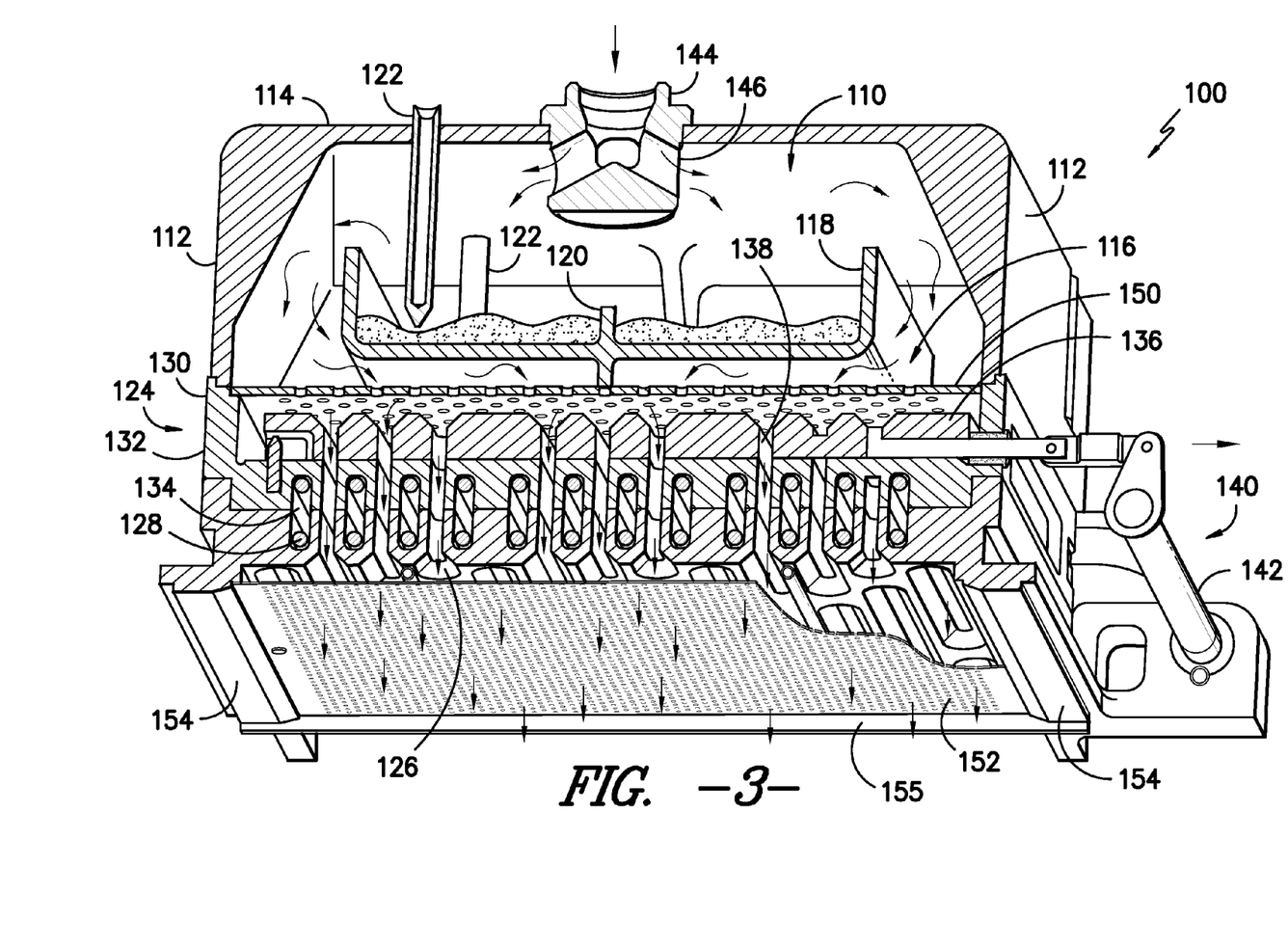
FIG. 3 is a cross-sectional view of the embodiment of FIG. 2 in a second operational configuration.

The substrates 14 can then be transferred into and through the first vapor deposition chamber 19 for deposition of a thin film onto the substrates 14, such as a cadmium telluride thin film or a thin film comprised of another photovoltaic absorber material. The first vapor deposition chamber 19 can include the deposition apparatus 100, such as shown in FIGS. 2-3 and discussed in greater detail below. As diagrammatically illustrated in FIG. 1, a first feed device 24 is configured with the vapor deposition apparatus 100 to supply source material, such as granular cadmium telluride. The feed device 24 may take on various configurations within the scope and spirit of the invention, and functions to supply the source material without interrupting the continuous vapor deposition process within the apparatus 100 or conveyance of the substrates 14 through the apparatus 100.

After deposition of the thin film in the first vapor deposition chamber 19, the substrates 14 can be optionally transported into and through a second vapor deposition chamber 21 for subsequent vapor treatment of the thin film. The second vapor deposition chamber 21 can also include the deposition apparatus 100, such as shown in FIGS. 2-3. As diagrammatically illustrated in FIG. 1, a second feed device 25 is configured with the vapor deposition apparatus 100 to supply treatment material, such as cadmium chloride. The second feed device 24 may take on various configurations within the scope and spirit of the invention, and functions to supply the source material without interrupting the continuous vapor deposition process within the apparatus 100 or conveyance of the substrates 14 through the apparatus 100. Thus, the cadmium telluride thin film on the substrates 14 can be treated with cadmium chloride within the system 10 without prior exposure to the outside environment.

Between the first vapor deposition chamber 19 and the second vapor deposition chamber 21 a heating chamber, the substrates 14 can be transported into and through a post-heat chamber 22 and first cooling chamber 23. In the illustrated embodiment of system 10, at least one post-heat chamber 22 is located immediately downstream of the vapor deposition apparatus 100 and upstream of the second vapor deposition chamber 21 in a conveyance direction of the substrates 14. The post-heat chamber 22 maintains a controlled heating profile of the substrate 14 until the entire substrate is moved out of the first vapor deposition chamber 19 to prevent damage to the substrate 14, such as warping or breaking caused by uncontrolled or drastic thermal stresses. If the leading section of the substrate 14 were allowed to cool at an excessive rate as it exited the apparatus 100, a potentially damaging temperature gradient would be generated longitudinally along the substrate 14. This condition could result in breaking, cracking, or warping of the substrate from thermal stress.

Then, the substrates 14 can be cooled in the first cooling chamber 23 to a vapor treatment temperature prior to entering the optional second vapor deposition chamber 21. For example, first cooling chamber 23 can subsequently cool the substrates to a vapor treatment temperature that is less than the deposition temperature prior to entering the second vapor deposition chamber 21. The treatment temperature can be, for instance, about 20° C. to about the anneal temperature discussed below.

The substrates 14 can be transported from the second vapor deposition chamber 21 into the anneal chamber 27 heated by heater 18. The substrates 14 can be annealed in the anneal chamber 27 by heating to an anneal temperature of 350° C. to about 500° C. after treatment of the cadmium telluride layer with the cadmium chloride vapors, such as about 375° C. to about 450° C. or about 390° C. to about 420° C.

The quenching chamber(s) 200, 201 are positioned downstream of the first vapor deposition chamber 19 and the optional second deposition chamber 21.

An exit vacuum lock station 15 is configured downstream of the quenching chambers 200, 201, and operates essentially in reverse of the entry vacuum lock station 12 described above. For example, the exit vacuum lock station 15 may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the system 10 in a step-wise fashion without loss of vacuum condition within the system 10.

System 10 also includes a conveyor system configured to move the substrates 14 into, through, and out of each of load vacuum station 12, the pre-heating station 12, the first vapor deposition chamber 19, the post-heat chamber 22, the first cooling chamber 23, the second vapor deposition chamber 21, the annealing chamber 27, and the quenching chambers 200, 201. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2-3 relate to a particular embodiment of the vapor deposition apparatus 100, that can be utilized in either or both of the first vapor deposition chamber 19 and/or the second vapor deposition chamber 21. The apparatus 100 includes a deposition head 110 defining an interior space in which a receptacle 116 is configured for receipt of a source material (not shown) or treatment material. As mentioned, the source material or treatment material may be supplied by a feed device or system 24, 25, respectively, via a feed tube. The feed tube is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls. For example, the receptacle 116 can have a shape and configuration such that the transversely extending end walls 118 of the receptacle 116 are spaced from the end walls 112 of the head chamber 110. The longitudinally extending side walls 117 of the receptacle 116 lie adjacent to and in close proximity to the side walls 113 of the deposition head so that very little clearance exists between the respective walls, as depicted in FIG. 5. With this configuration, sublimated source material will flow out of the open top of the receptacle 116 and downwardly over the transverse end walls 118 as leading and trailing curtains of vapor 119 over, as depicted by the flow lines in FIGS. 2-3. Very little of the sublimated source material will flow over the side walls 117 of the receptacle 116. The curtains of vapor 119 are "transversely" oriented in that they extend across the transverse dimension of the deposition head 110, which is generally perpendicular to the conveyance direction of the substrates through the system.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the head chamber 110. Desirably, the coolest component in the head chamber 110 is the upper surface of the substrates 14 conveyed therethrough so as to ensure that the sublimated source material plates onto the substrate, and not onto components of the head chamber 110.

Still referring to FIGS. 2 and 3, the heated distribution manifold 124 includes a plurality of passages 126 defined therethrough. These passages have a shape and configuration so as to uniformly distribute the sublimated source material towards the underlying substrates 14.

In the illustrated embodiment, a distribution plate 152 is disposed below the distribution manifold 124 at a defined distance above a horizontal plane of the upper surface of an underlying substrate 14. This distance may be, for example, between about 0.3 cm and about 4.0 cm. In a particular embodiment, the distance is about 1.0 cm. The conveyance rate of the substrates below the distribution plate 152 may be in the range of, for example, about 10 mm/sec to about 40 mm/sec. In a particular embodiment, this rate may be, for example, about 20 mm/sec. The thickness of the CdTe film layer that plates onto the upper surface of the substrate 14 can vary within the scope and spirit of the invention, and may be, for example, between about 1 micron and about 5 microns. In a particular embodiment, the film thickness may be about 3 microns.

The distribution plate 152 includes a pattern of passages, such as holes, slits, and the like, therethrough that further distribute the sublimated source material passing through the distribution manifold 124 such that the source material vapors are uninterrupted in the transverse direction. In other words, the pattern of passages are shaped and staggered or otherwise positioned to ensure that the sublimated source material is deposited completely over the substrate in the transverse direction so that longitudinal streaks or stripes of "un-coated" regions on the substrate are avoided.

As previously mentioned, a significant portion of the sublimated source material will flow out of the receptacle 116 as leading and trailing curtains of vapor. Although these curtains of vapor will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, as discussed above, because the system 10 conveys the substrates 14 through the vapor deposition apparatus 100 at a constant (non-stop) linear speed, the upper surfaces of the substrates 14 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface of the substrates 14 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124, as discussed in greater detail below. In other words, the debris shield 150 can be configured to act as a breathable screen that inhibits the passage of particles without substantially interfering with vapors flowing through the shield 150.

Referring to FIGS. 2-3 in particular, apparatus 100 desirably includes transversely extending seals 154 at each longitudinal end of the head chamber 110. In the illustrated embodiment, the seals define an entry slot 156 and an exit slot 158 at the longitudinal ends of the head chamber 110. These seals 154 are disposed at a distance above the upper surface of the substrates 14 that is less than the distance between the surface of the substrates 14 and the distribution plate 152. The seals 154 help to maintain the sublimated source material in the deposition area above the substrates. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124. It should also be appreciated that the seals 154 may cooperate with other structure of the vapor deposition apparatus 100 to provide the sealing function. For example, the seals may engage against structure of the underlying conveyor assembly in the deposition area.

Any manner of longitudinally extending seal structure 155 may also be configured with the apparatus 100 to provide a seal along the longitudinal sides thereof. Referring to FIGS. 2 and 3, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 2 and 3, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3. As can be readily appreciated from FIG. 3, in this operational position of the shutter plate 136, the sublimated source material is free to flow through the shutter plate 136 and through the passages 126 in the distribution manifold 124 for subsequent distribution through the plate 152. Referring to FIG. 2, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 2 and 3 is particularly beneficial in that, for whatever reason, the sublimated source material can be quickly and easily contained within the head chamber 110 and prevented from passing through to the deposition area above the conveying unit. This may be desired, for example, during start up of the system 10 while the concentration of vapors within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

The vapor deposition apparatus 100 may further comprise a conveyor disposed below the head chamber 110. This conveyor may be uniquely configured for the deposition process as compared to the conveyors 48 discussed above with respect to the system 10 of FIG. 1. For example, the conveyor may be a self-contained conveying unit that includes a continuous loop conveyor on which the substrates 14 are supported below the distribution plate 152. It should be appreciated, however, that the invention is not limited to any particular type of conveyor for moving the substrates 14 through the vapor deposition apparatus 100.

The present invention also encompasses various process embodiments for vapor deposition of a sublimated source material to form a thin film on a PV module substrate, and subsequent vapor treatment and, as such, is not necessarily limited to CdTe-specific applications of this process. The various processes may be practiced with the system embodiments described above or by any other configuration of suitable system components. It should thus be appreciated that the process embodiments according to the invention are not limited to the system configuration described herein. Desirably, the process embodiments include continuously conveying the substrates at a constant linear speed during the vapor deposition process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A process of forming a thin film photovoltaic device, the process comprising:
   depositing a photovoltaic absorber layer on a glass substrate;
   heating the glass substrate to an anneal temperature; and,
   quenching the glass substrate with a quenching gas to cool the glass substrate to a quenched temperature in less than 10 seconds, the quenched temperature being about 85° C. to about 200° C. less than the anneal temperature, and wherein the quenching gas comprises an inert gas, and wherein the glass substrate has a temperature gradient across its surface of less than 20° C. during quenching.

2. The process as in claim 1, wherein the anneal temperature is about 575° C. to about 650° C.

3. The process as in claim 2, wherein the quenched temperature is 500° C. or less.

4. The process of claim 1, wherein the quenching gas has a quenching temperature of about 0° C. to about 100° C.

5. The process of claim 1, wherein the quenching gas is substantially free from oxygen.

6. The process of claim 1, wherein the glass substrate comprises borosilicate glass.

7. The process of claim 6, wherein the glass substrate has a thickness of about 0.5 mm to about 2.5 mm.

8. The process of claim 1, wherein quenching the glass substrate to cool the glass substrate to the quenched temperature is performed in a first quenching chamber.

9. The process of claim 8, further comprising:
   transporting the glass substrate from the first quenching chamber to a second quenching chamber; and
   cooling the glass substrate in the second quenching chamber to a second quenched temperature in a second quenching time of about 4 seconds to about 30 seconds, wherein the second quenched temperature is at least 100° C. less than the quenched temperature.

10. The process of claim 9, wherein the second quenched temperature is about 225° C. to about 375° C.

11. The process of claim 1, further comprising:
monitoring the temperature gradient across the surface of the glass substrate during quenching.

12. The process of claim 1, wherein the photovoltaic absorber layer comprises cadmium telluride, the process further comprising:
treating the photovoltaic absorber layer with cadmium chloride prior to heating and quenching.

13. The process of claim 12, wherein the photovoltaic absorber layer is treated with cadmium chloride via depositing cadmium chloride as a film layer on the cadmium telluride layer prior to annealing the cadmium telluride layer.

14. A process for forming a thin film photovoltaic device, the process comprising:
depositing a cadmium telluride layer on a substrate in a vapor deposition chamber by heating a source material to produce source vapors that deposit onto the substrate, wherein the substrate has a deposition temperature of about 450° C. to about 600° C.;
transporting the substrate from the vapor deposition chamber into an annealing chamber;
heating the substrate to an anneal temperature to anneal the cadmium telluride layer, wherein the anneal temperature is about 575° C. to about 650° C.;
transporting the substrate from the annealing chamber into a quenching chamber;
quenching the glass substrate to cool the glass substrate to a quenched temperature of less than 500° C. in a quenching time of less than 10 seconds, wherein the quenching atmosphere has a quenching pressure of about 1 torr or more, and wherein the quenching atmosphere comprises an inert gas, wherein the quenching chamber comprises a plurality of coolant elements, and wherein each coolant element is configured to reduce the temperature of a surface of the glass substrate in a zone adjacent to the coolant element;
monitoring the temperature across the surface of the glass substrate during quenching at a plurality of points; and
adjusting the plurality of coolant elements to reduce any temperature gradient detected across the surface of the glass substrate.

15. The process of claim 14, wherein the substrate is transported from the vapor deposition chamber through a second deposition chamber and then into the annealing chamber.

16. The process of claim 15, further comprising:
transporting the substrate from the vapor deposition chamber into the second deposition chamber, wherein the second vapor deposition chamber comprises a treatment material, wherein the treatment material comprises cadmium chloride; and,
treating the cadmium telluride layer by heating the treatment material to produce treatment vapors that deposit onto the substrate;
thereafter, transporting the substrate from the second vapor deposition chamber to the annealing chamber.

17. The process of claim 14, further comprising:
oscillating the glass substrate during quenching.

* * * * *